United States Patent [19]
Le et al.

[11] Patent Number: 5,844,840
[45] Date of Patent: Dec. 1, 1998

[54] HIGH VOLTAGE NMOS PASS GATE HAVING SUPPLY RANGE, AREA, AND SPEED ADVANTAGES

[75] Inventors: Binh Quang Le, Mountain View; Pau-Ling Chen, Saratoga; Shane Charles Hollmer, San Jose; Chung-You Hu, Sunnyvale; Narbeh Derhacobian, Belmont, all of Calif.

[73] Assignee: Advanced Micro Devices, Inc., Sunnyvale, Calif.

[21] Appl. No.: 914,543

[22] Filed: Aug. 19, 1997

[51] Int. Cl.$^6$ ...................................................... G11C 16/06
[52] U.S. Cl. ................ 365/185.23; 365/226; 365/230.06
[58] Field of Search .......................... 365/185.23, 230.06, 365/226

[56] References Cited

U.S. PATENT DOCUMENTS

| | | | |
|---|---|---|---|
| 5,524,095 | 6/1996 | Someya et al. ..................... | 365/230.06 |
| 5,619,448 | 4/1997 | Lin ..................................... | 365/185.23 |
| 5,659,502 | 8/1997 | Sali et al. ........................... | 365/185.23 |
| 5,721,704 | 2/1998 | Morton ............................... | 365/185.23 |

Primary Examiner—Son T. Dinh
Attorney, Agent, or Firm—Fliesler, Dubb, Meyer & Lovejoy

[57] ABSTRACT

According to an aspect of the embodiments, the block decoder control circuits which drive the pass transistors for the word lines for a flash memory array are driven with a control voltage that is regulated to be one enhancement transistors threshold voltage higher than the highest voltage that is actually driven onto the word lines. According to another aspect of some of the embodiments, the block decoder control circuits are implemented with transistors having a very low threshold voltage. According to yet another aspect of some of the embodiments, a special series connection is used to prevent any leakage current through the block decoder control circuit from the high voltage generating charge pumps which might otherwise result from the use of low threshold voltage transistors. In the special series connection, any leakage current occurs from the supply voltage source rather than from the high voltage generating charge pumps. According to still another aspect of some of the embodiments, a special gate connection applies an intermediate bias voltage higher than a positive supply voltage onto the gates of the unselected block decoder transistors that are connected to a high-voltage. Several embodiments are presented which combine the regulated control voltage aspect and various combinations of the other aspects.

40 Claims, 13 Drawing Sheets

HIGH VOLTAGE NMOS PASS GATE HAVING SUPPLY RANGE, AREA, AND SPEED ADVANTAGES

BACKGROUND OF THE INVENTION

1. Field of the Invention

The present invention relates to the field of flash memory integrated circuits. Specifically, the present invention relates to high-voltage circuits used for programming and erasing flash memory. The high-voltage circuits use NMOS transistors to pass internally generated high-voltages to flash memory.

2. Discussion of the Related Art

In flash memory integrated circuits, high voltages are generated on the chip for programming purposes. These high voltages (around 20 V) are much higher than the highest supply voltage (around 3 V), and are typically produced by large charge pumps. Because these charge pumps consume power and circuit area, it is desirable to minimize the total capacitance that these high voltage generators drive.

In most CMOS integrated circuits, PMOS transistors are used to pass the higher supply voltages, while NMOS transistors are used to pass the lower supply voltages. For example, PMOS transistors are used to implement pull up circuits, while NMOS transistors are used to implement pull down circuits. However, PMOS transistor subcircuits in a CMOS integrated circuit must be electrically isolated in an N-type well which must be biased at or above the same high voltage to guarantee that the P/N junction formed by the P-type drain/source regions of the PMOS transistors and the N-type well are not forward biased. If PMOS transistors are used in the high-voltage subcircuits, these N-type isolation wells constitute a very large capacitance for the on-chip high voltage generator to drive. Moreover, the N-type isolation well itself increases area and adds process complexity. Because NMOS transistors are typically fabricated on a P-type substrate, NMOS transistors require no isolation well. Thus, they are relatively easy to fabricate with a simple process. Therefore, in high-voltage subcircuits supplied by on-chip high-voltage generators, the use of NMOS transistors is typically preferable to the use of PMOS transistors.

However, the voltage which can be passed by an NMOS transistor is limited by the transistor's threshold voltage Vt. If a gate voltage Vg is applied to an NMOS transistor's gate, then the maximum voltage which can be passed from source to drain is Vg−Vt. If the voltage generator produces a maximum voltage Vpp (about 20 V), it is desirable for transistors passing or switching that high voltage to pass Vpp without incurring the threshold voltage drop. In other words, the pass transistors should pass Vpp rather than Vpp−Vt. Therefore, in order to pass a high voltage Vpp through an NMOS device, its gate must be boosted to a voltage higher than the high voltage by at least one threshold voltage Vt, so that Vpp+Vt must be applied to the gate of the NMOS pass transistor.

A conventional circuit which is used to pass a high voltage Vpp is illustrated in FIG. 1. The circuits of the kind illustrated in FIG. 1 are very important in NAND flash memory applications, especially for decoding circuits such as block and row decoders and high-voltage multiplexers. The conventional circuits and those according to the present invention will be described in conjunction with a NAND block decoder. A NAND flash memory string has more than one floating gate storage transistor. For example, each NAND memory string may contain sixteen storage transistors. Several NAND strings may be organized into a row so as to store sixteen words of data, such that each word is independently writeable and readable. Each word includes its own word line which is connected to one control gate of a data storage transistor in each NAND string in the row. The set of sixteen words which share the same NAND strings is referred to as a block. To write or read a word within a given block, that block must be selected by a block decoder so that specific voltages can be applied to the word lines within that block.

Unfortunately, the circuit in FIG. 1 has drawbacks. The first drawback is that the circuit performance is degraded as the supply voltage Vcc decreases. Moreover, the circuit is inoperative when the supply voltage Vcc is less than the sum of the threshold voltages VtM2 and VtM3 of transistors M2 and M3, respectively. In order to pass Vpp to the output OUT, node B (attached to the gate of M3) must be boosted to Vpp+VtM3. In order for node B to be boosted to Vpp+VtM3, node A must be boosted to Vpp+VtM3+VtM2. With supply voltages Vcc around 3 V, and threshold voltages above 1.5 V due to the body effect, the circuit in FIG. 1 does not function properly.

In order to boost node A to Vpp+VtM3+VtM2, the following inequality must hold in which CA is the total parasitic capacitance of node A.

$$Vcc*C/(C+CA) \geq VtM2+VtM3$$

In order for the circuit in FIG. 1 to function with low supply voltages Vcc less than or equal to 3 V, transistors M2 and M3 must have very low threshold voltages VtM2 and VtM3. However, the various manners of lowering the threshold voltage of a transistor all result in larger leakage currents from source to drain when the transistor is off.

Another way to attempt to satisfy the above inequality is to increase the coupling ratio C/(C+CA) by increasing the coupling capacitor C. However, capacitors are fairly large circuit elements and increasing C increases circuit area.

Typically, the high voltage pass gate of FIG. 1 is used to drive word lines of a memory array during a high-voltage operation such as programming. The memory array may have many thousands of word lines. Often only one word is programmed while all the other words are not programmed. In this case, only one of the word lines in the selected block is raised to Vpp while the other fifteen word lines in the selected block are raised to approximately one-half of Vpp; more importantly, the word lines in all of the unselected blocks are left floating. If transistor M3 is made to be a low threshold device and is replicated once for each word line, the sum of the leakage currents in all of the words in the unselected blocks will be very high, thus placing high current demands on the high voltage charge pump and wasting a large amount of power and rise time.

As is apparent from the above discussion, a need exists for a block decoder having small circuit area, low leakage current, and fast control of high voltage pass transistors.

SUMMARY OF THE INVENTION

Conventional high voltage NMOS pass gates in flash memory block decoders do not perform well at low supply voltages because the positive threshold voltages of the boost transistors must first be overcome before internal nodes even begin to increase in voltage. If the boost transistors in conventional pass gates are fabricated such that their threshold voltages are reduced so as to correspond with a supply voltage reduction, the leakage current through the numerous unselected pass gates will degrade the performance of the internal high-voltage generators. As a result, when applied in the context of integrated circuits having low supply voltages, conventional block decoders are either too slow in passing a high voltage or require circuitry which occupies too much area.

According to an aspect of the embodiments of the present invention, the block decoder control circuits which drive the pass transistors for the word lines for the flash memory array are driven with a control voltage generated by a strong global charge pump that is regulated to be one enhancement transistor's threshold voltage higher than the highest voltage that is actually driven onto the word lines. By using this elevated voltage from the global pump, the block decoder control circuits are able to boost the large pass gate loading much more quickly for a given circuit size. Therefore, block decoder circuit latency and area are reduced.

According to another aspect of some of the embodiments of the present invention, the block decoder control circuits are implemented with transistors having a very low threshold voltage. The coupling capacitor ratio times the supply voltage must exceed the transistor threshold voltage in order for boosting to occur. Because the block decoder transistors have a low threshold voltage, these embodiments are able to operate with lower supply voltages and/or lower capacitor coupling ratios. Lower capacitor coupling ratios can be implemented with smaller coupling capacitors, thereby reducing the block decoder control circuit area.

According to yet another aspect of some of the embodiments of the present invention, a special series connection is used to prevent any leakage current through the block decoder control circuit from the high voltage generating charge pumps which might otherwise result from the use of low threshold voltage transistors. In the special series connection, any leakage current occurs from the supply voltage source rather than from the high voltage generating charge pumps, and this leakage occurs only during the programming period, not during normal low-voltage operations.

According to still another aspect of some of the embodiments of the present invention, a special gate connection applies an intermediate bias voltage onto the gates of the unselected block decoder transistors that-are connected to a high-voltage. This special gate connection increases the junction breakdown margin of the transistors that are connected to the high-voltage.

An embodiment of the block decoder control circuit according to the present invention uses the regulated control voltage, the low threshold voltage transistors, and the special series connection. This embodiment uses two coupling capacitors and ten low threshold voltage transistors Another embodiment of the block decoder control circuit according to the present invention uses the regulated control voltage and the special gate connection. This embodiment uses four coupling capacitors and thirteen enhancement transistors.

Yet another embodiment of the block decoder control circuit according to the present invention uses the regulated control voltage, the low threshold voltage transistors, and the special gate connection. This embodiment uses four coupling capacitors and thirteen low threshold voltage transistors.

Still another embodiment of the block decoder control circuit according to the present invention uses the regulated control voltage, the low threshold voltage transistors, and the special series connection. This embodiment uses four coupling capacitors and fourteen low threshold voltage transistors.

Yet still another embodiment of the block decoder control circuit according to the present invention uses the regulated control voltage, the low threshold voltage transistors, the special series connection, and the special gate connection. This embodiment uses four coupling capacitors and twenty-one low threshold voltage transistors.

These and other features and advantages of the embodiment of the present invention are fully described in the Detailed Description of the Invention with reference to the Figures.

The Figures are more fully described in the Detailed Description of the Invention.

DETAILED DESCRIPTION OF THE INVENTION

Figure 2:
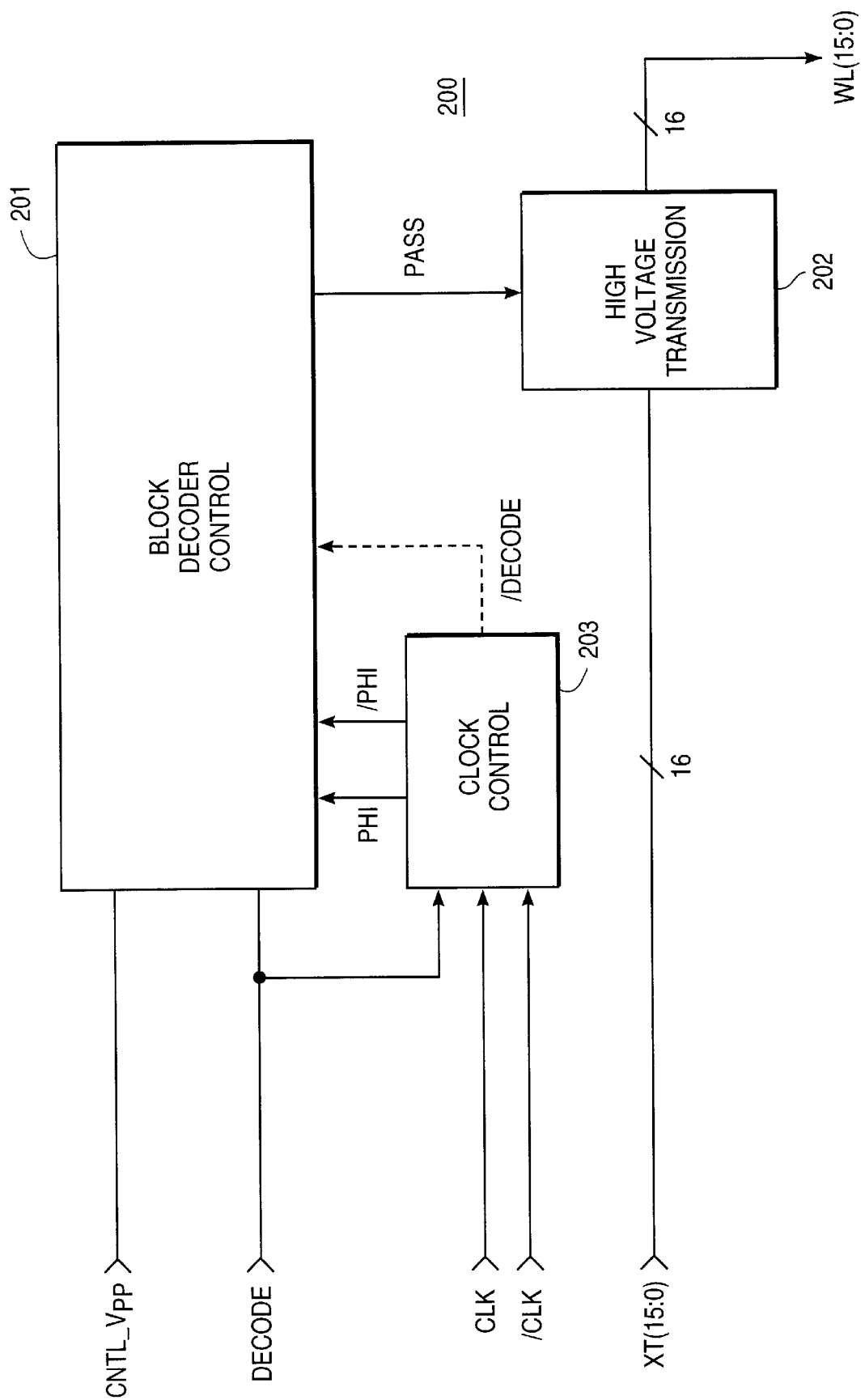
FIG. 2 is a block diagram of a block decoder circuit suitable for use in a flash memory array constructed of sixteen bit NAND strings.

FIG. 2 illustrates one possible environment for the conventional circuits and the circuits according to the present invention. The block decoder 200 illustrated in FIG. 2 controls an sixteen-word block, although it is to be understood that any number of words can be controlled. The number of words in each block is determined by the number of storage transistors per NAND string. The specific voltages to be applied to the word lines WL(15:0) of the selected block are inputs XT(15:0). The DECODE signal input is high when the block decoder 200 is selected so that it passes XT(15:0) onto WL(15:0); when the DECODE input is low, word lines WL(15:0) are floating. The clock CLK and inverse clock /CLK are alternate phases of a clock signal which is distributed when high voltage is being generated. The CNTLVpp input signal is the high voltage input to the block decoder control circuit 201. The PASS output signal of the block decoder control circuit 201 enables the high voltage transmission circuit 202 to connect XT(15:0) to WL(15:0). The clock control circuit 203 enables the cycling of the local clock signals PHI and /PHI when the block decoder 200 is selected; when the block decoder 200 is not selected, the clock control circuit 203 disables the cycling of the local clock signals PHI and /PHI. If the block decoder control circuit 201 requires the inverted decode signal /DECODE and the inverted decode signal /DECODE is not supplied to the block decoder 200, the clock control circuit 203 generates and delivers the inverted decode signal /DECODE to the block decoder control circuit 201.

Figure 3:
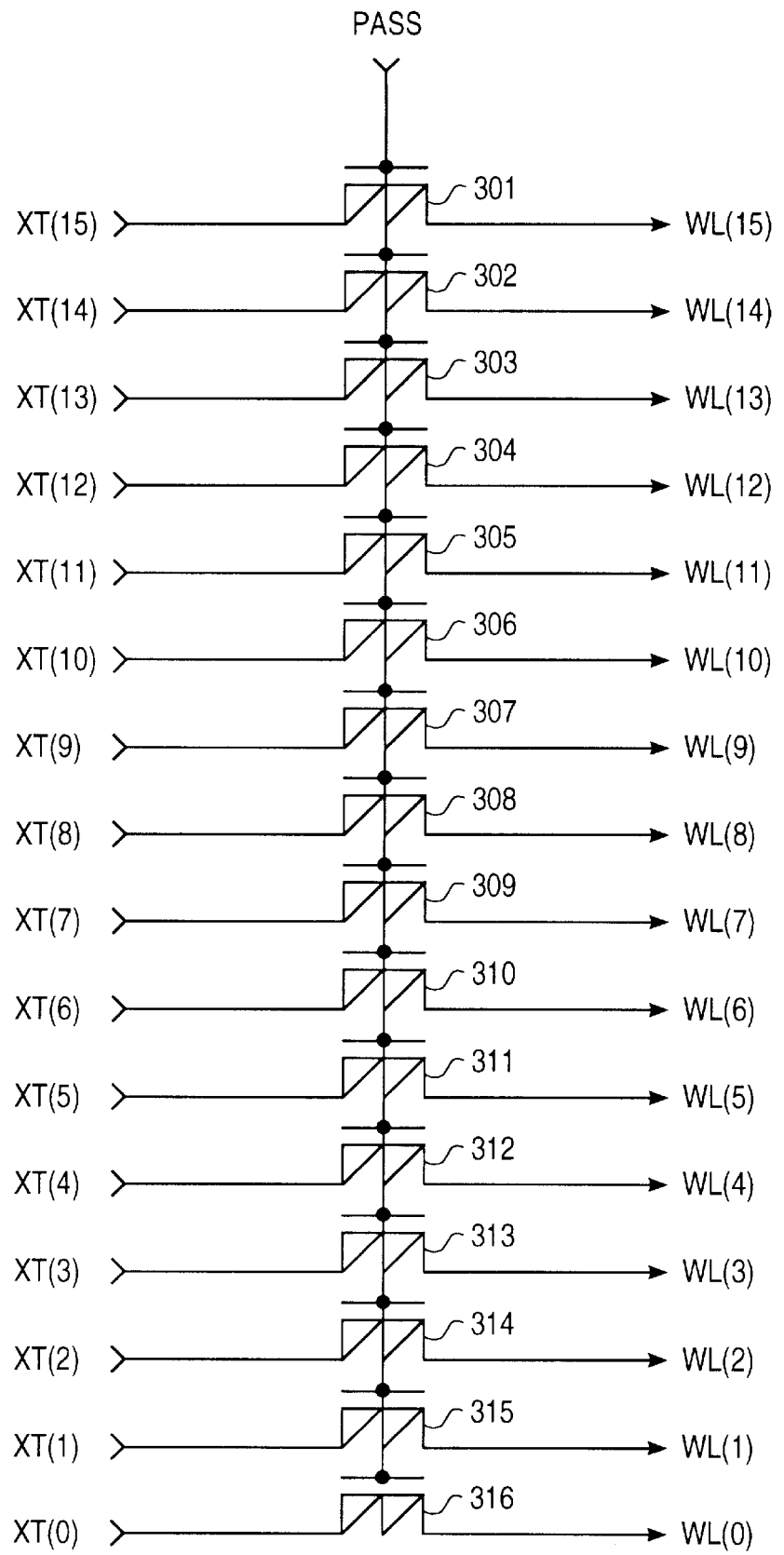
FIG. 3 illustrates a high-voltage transmission circuit suitable for use in the block decoder circuit illustrated in FIG. 2.

FIG. 3 illustrates the high voltage transmission circuit 202. Sixteen separate pass transistors 301 through 316 are gated by the PASS signal and are used to enable the passing of the voltages on XT(15:0) out to the word lines WL(15:0). This high voltage transmission circuit 202 is ideal for use in a block decoder in which each block consists of sixteen words which share the same sixteen-storage transistor NAND strings.

Figure 4:
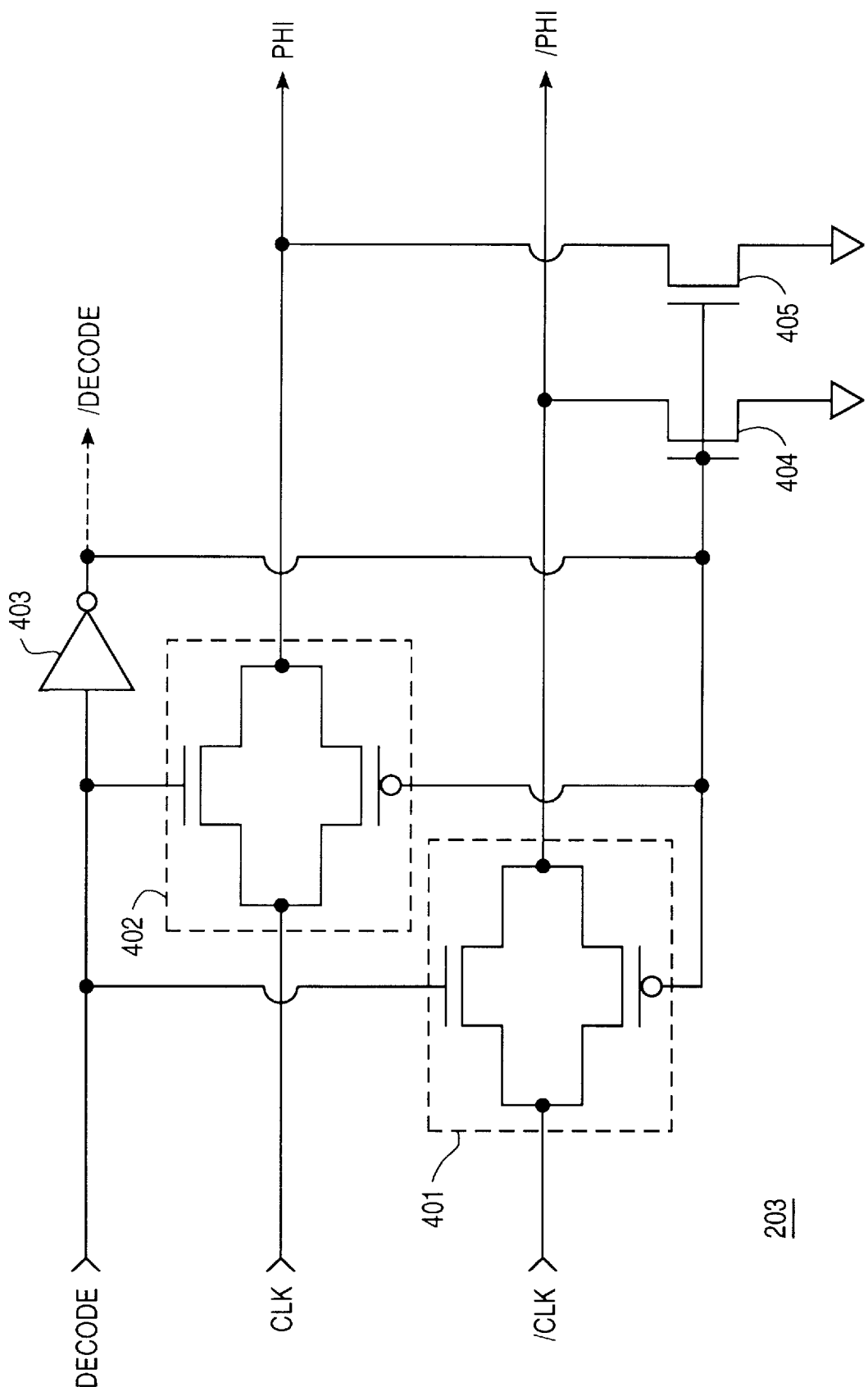
FIG. 4 illustrates a clock control circuit suitable for use in the block decoder circuit illustrated in FIG. 2.

FIG. 4 illustrates the clock control circuit 203. The non-overlapping global clocks CLK and /CLK are gated by two CMOS transmission gates 401 and 402. The DECODE signal is inverted by inverter 403 to produce the inverted decode signal /DECODE. When DECODE is high and /DECODE is low, the global clocks CLK and /CLK are passed through transmission gates 401 and 402 so that the local clocks PHI and /PHI are oscillating. When DECODE is low, /DECODE enables the pulldown transistors 404 and 405 to hold the local clocks PHI and /PHI to ground. The above-described clock control circuit 203 is shown by way of example. There are a variety of alternative ways to implement the clock circuit. For example, /PHI can be generated by a two-input NAND gate having DECODE and CLK as inputs; PHI is then generated by an inverter having /PHI as input. The non-overlapping clock control circuit 203 is the preferred implementation for use with the circuits of the present invention.

Figure 5A:
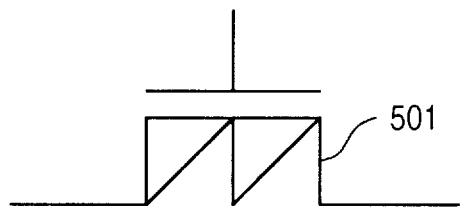
FIG. 5A is a symbol for an NMOS enhancement transistor having a positive threshold voltage.
Figure 5B:
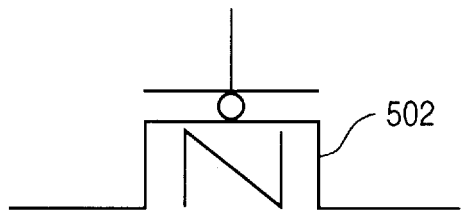
FIG. 5B is a symbol for an Z-type transistor having a threshold voltage of approximately zero when its source and body voltages are equal.

FIG. 5A illustrates a transistor 501 without a field implant but with an enhancement threshold implant. The threshold voltage of this transistor 501 with 20 Volts of body effect is about 2 Volts. This threshold voltage (VThigh) is incurred when the transistor 501 operates at source and drain voltages near 20 Volts. FIG. 5B illustrates a Z-type transistor 502 with neither a field implant nor an enhancement threshold implant. The threshold voltage of this transistor 502 with 20 Volts of body effect is about 1.3 Volts. This threshold voltage (VTz) is incurred when the transistor 502 operates at source and drain voltages near 20 Volts. The maximum oxide breakdown voltage is about 22 Volts for the high voltage NMOS of either type 501 or 502. The following technological parameters also apply to each of the transistors 501 and 502. The maximum P-N junction breakdown is about 20 Volts if the gate voltage is zero volts; while the maximum P-N junction breakdown is about 29 Volts if the gate voltage is ten volts. The P-N junction breakdown voltage varies almost linearly with the gate voltage when the gate voltage is between zero and ten volts. The maximum metal field turn on voltage is about 22 Volts.

The following table describes some of the performance characteristics of the block decoder control circuit according to the preferred embodiment of the present invention.

Figure 1:
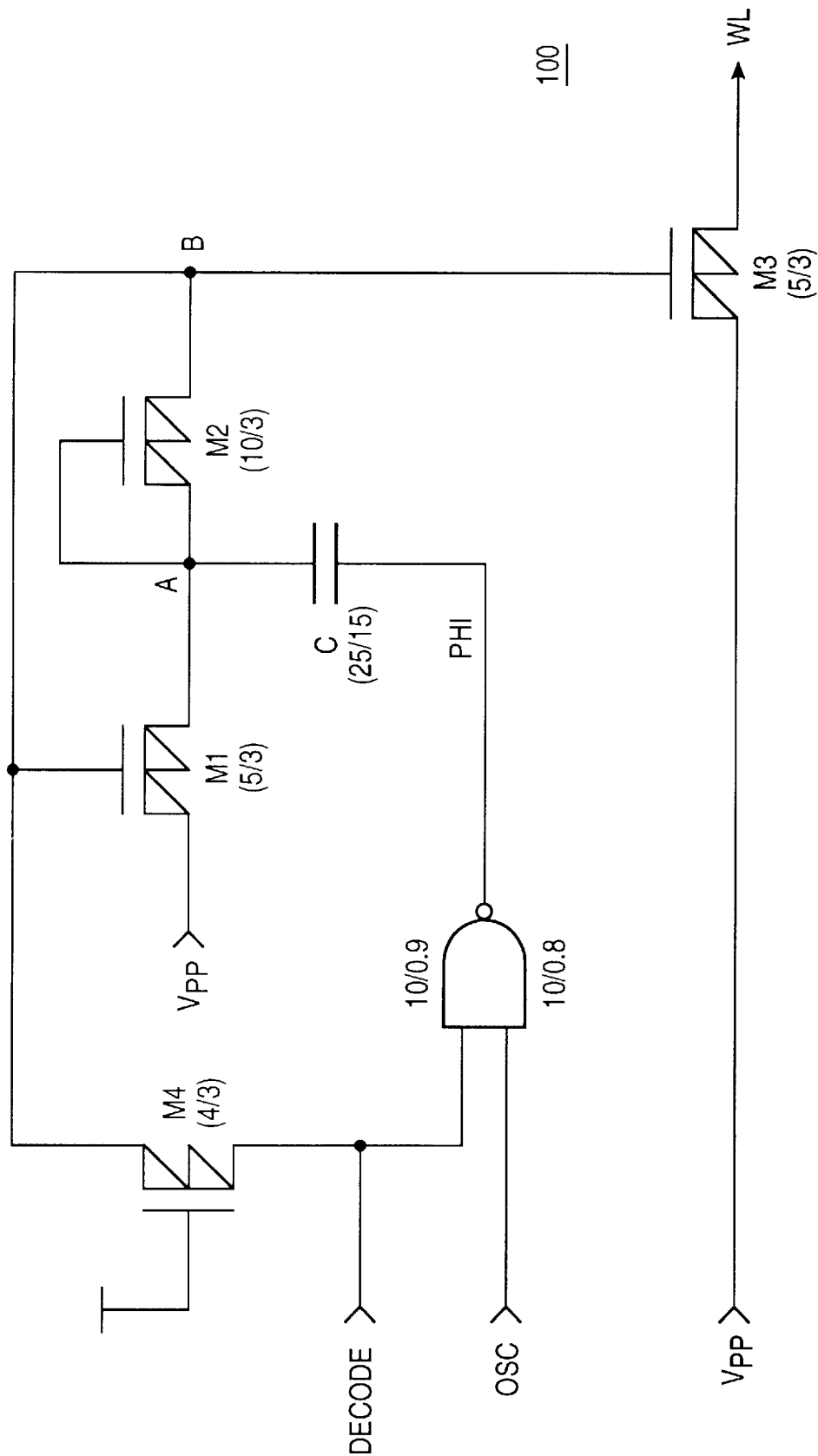
FIG. 1 illustrates a conventional high-voltage pass gate using a NMOS transistors and local generation of high voltage control.

|  | Minimum operating Vcc (Volts) | Area of Capacitor (square microns) | Response speed | Junction breakdown margin (Volts) | Punch through |
| --- | --- | --- | --- | --- | --- |
| Conventional (FIG. 1) | 2 VThigh (~4.3 V) | 375 | Very Slow | 0 | Possible |
| Present Invention (FIG. 12A–12B) | 1 VTz (~1.6 V) | 100 | Very Fast | 4 V to 5 V | Not Possible |

The block decoder circuits according to the present invention function correctly even with a very low power supply voltage Vcc. The conventional circuit 100 illustrated in FIG. 1 includes a diodeconnected transistor M2 in the high voltage path, which increases the requirement for the voltage swing of the PHI signal thereby requiring a higher Vcc voltage supply. As can be seen from the table above, the minimum operating power supply Vcc for the conventional circuit is greater than twice the threshold voltage of the NMOS devices operating with 20 Volts of body effect (about 4.3 V). In contrast, the circuits according to the present invention do not include the diode-connected transistor, thus they require voltage swings for PHI greater than only one Z-type threshold voltage (about 1.6 V).

A Z-type transistor has essentially a zero threshold voltage when operating at low voltages. In practice, the threshold voltage VTz of a Z-type NMOS transistor may be very low or slightly negative when operating at low voltages. In high voltage circuits such as according to the present invention, 20 Volts of body effect increases the threshold voltage to approximately 1.3 Volts. However, when the gate to source voltage is zero, there is a certain non-zero leakage current in the Z-type transistor.

Figure 6:
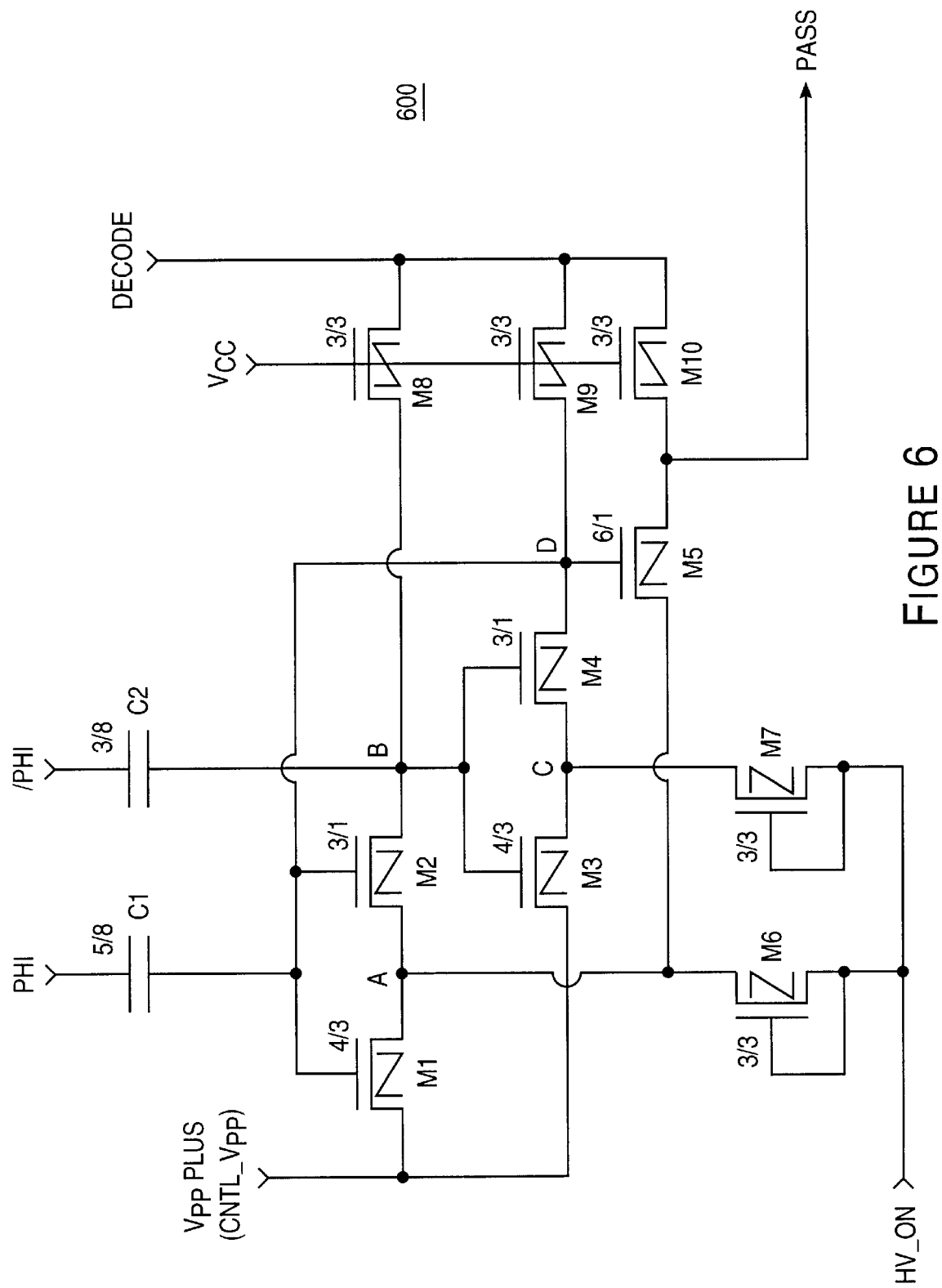
FIG. 6 illustrates an embodiment according to the present invention of a block decoder control circuit using Z-type transistors.
Figure 7:
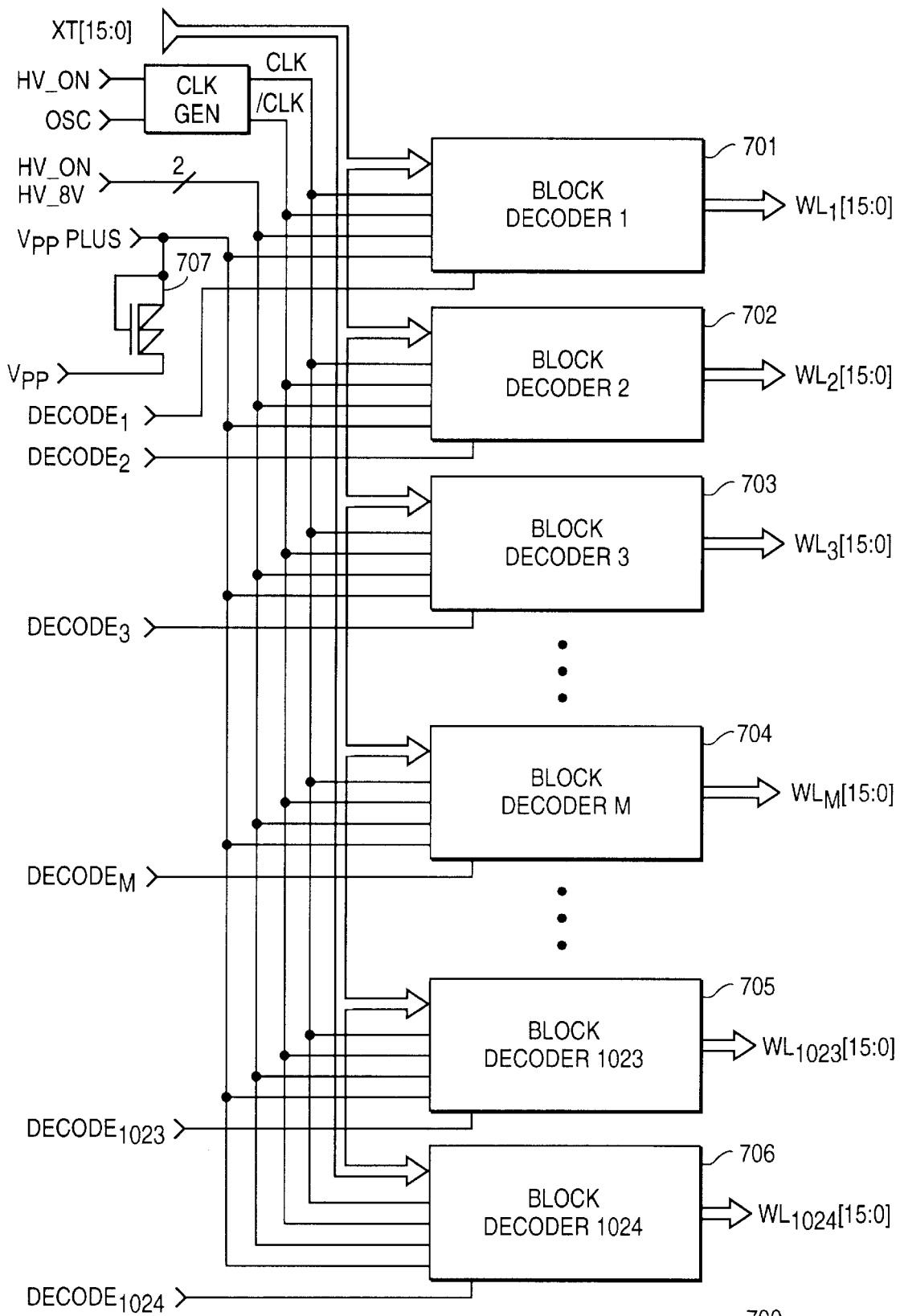
FIG. 7 illustrates a block diagram of a vector of block decoder circuits and their control signals suitable for use with a NAND flash memory array.

FIG. 6 illustrates an embodiment 600 of a block decoder control circuit 201 according to the present invention. The embodiment 600 is constructed with Z-type transistors. A key feature of the block decoder control circuits according to the present invention is the usage of the voltage VppPlus, which is regulated so as to be greater than the programming voltage Vpp by at least one-threshold voltage of an enhancement mode transistor operated at high voltage. FIG. 7 illustrates a typical application for the circuits according to the present invention. In a typical NAND flash memory chip, the block decoder circuits 701–706 are instantiated over one thousand times. Each block decoder circuit 701–706 is an instantiation of the block decoder circuit 200 illustrated in FIG. 2. Only one of the block decoder circuits 701–706 is selected at any given time; the remaining block decoder circuits are unselected. Conventionally, even a small amount of leakage current from the high voltage source through each unselected block will add up to a significant leakage current when multiplied by the number of unselected blocks, which is 1023 in the example of FIG. 7; therefore, the present invention makes sure to virtually eliminate even the smallest leakage current from each unselected block. This total leakage current can add up to about 500 microamps or more and can degrade the high voltage from the high voltage generator.

In order to stop this leakage current (or at least reduce it by a few orders of magnitude) according to the present invention, it is desirable to create circumstances under which the Z-type transistors will have a negative gate to source voltage. One way to accomplish this result is to tie the gate at zero volts and the source to Vcc so that Vgs is −Vcc. In this case, the threshold voltage of the device also increases so as to become positive due to the body effect created by the source voltage being elevated to Vcc.

Figure 5C:
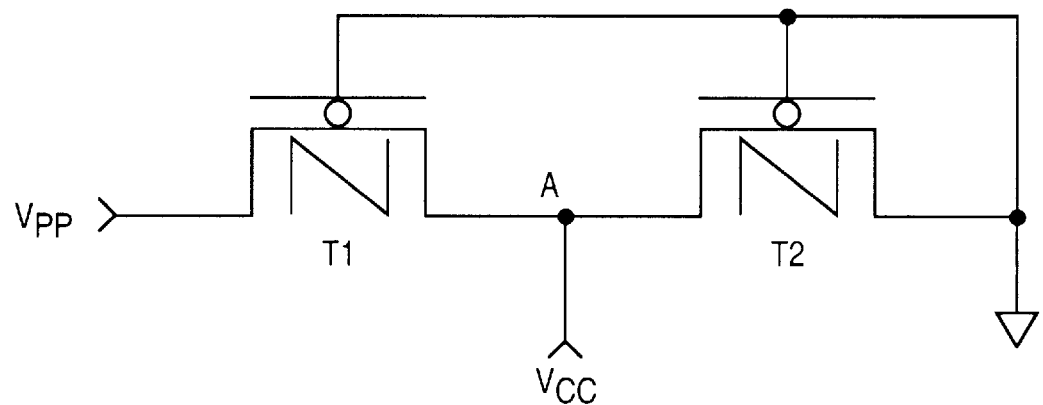
FIG. 5C is a subcircuit configured according to the present invention for preventing leakage from a high-voltage node Vpp using Z-type transistors.

FIG. 5C illustrates the circuit technique utilized in the circuits according to the present invention. Node A is driven to Vcc while the drain of transistor T1 is driven to Vpp. Under these circumstances, the drain to source leakage through transistor T1 is very small because Vgs is negative (−Vcc). Moreover, because the source voltage of transistor T1 is Vcc, there is an increase in transistor T1's threshold voltage. Thus, there is only a negligible leakage from the high voltage charge pump which generates Vpp, and the high programming voltage is not affected. However, transistor T2 has a larger drain to source leakage current because vgs is zero. However, this leakage current is from the power supply Vcc, not from the global charge pump. Furthermore, because the source and body voltages are both zero, there is no body effect back biasing, thus the threshold voltage of the Z-type transistor T2 is not increased.

The gates of the pass transistors 301–316 represent a very large capacitance of about 0.3 picofarads or greater in the presently preferred embodiment. Unlike the conventional block decoder shown in FIG. 1, the block decoder control circuits according to the present invention do not use capacitors connected to the clocks to charge the gates of the pass transistors 301–316 which drive the word lines, nor are the capacitors used to couple up the gates of the pass transistors 301–316 directly. Instead, the capacitors in the circuits according to the present invention are used only to couple up the gates of small, low capacitance transistors. Because the capacitors connected to the clocks do not drive or couple up the large capacitance PASS node at the gates of transistors 301–316 which drive the word lines WL(15:0), the capacitors connected to the clocks can be made much smaller, thus decreasing the area required for implementing these capacitors to about 100 square microns from the 375 square microns required by the conventional circuit 100.

In each block decoder according to the present invention, the PASS node at the gates of transistors 301–316 which drive the word lines WL(15:0) is driven directly by a strong global charge pump which produces a voltage VppPlus, which is one enhancement transistor threshold voltage above the programming voltage Vpp. Thus, VppPlus is greater than or equal to Vpp+Vt. This signal VppPlus also provides the supply voltage CNTL_Vpp for the block decoder control circuits according to the present invention so that all internal nodes are driven by VppPlus. This increases the speed of the circuit because when the block decoder is selected, the minimum voltage at the PASS node is nonetheless high enough to enable the pass transistors 301–316 to pass the full value of Vpp even during the low phases of the clock PHI when capacitive coupling is not boosting the voltage of the PASS node.

FIG. 6 is an embodiment 600 of the block decoder control circuit 201 according to the present invention. When the block decoder control circuit 600 is unselected, the DECODE signal is deasserted to ground, so that nodes B and D and the PASS signal are held low by transistors M8, M9, and M10, respectively. This simultaneously holds the gates of transistors M1, M2, M3, M4, and M5 at zero volts as well. Under these circumstances, the transistor pairs M1 and M2, M3 and M4, and M1 and M5 are each biased exactly as described above with reference to FIG. 5C. When the high voltage charge pumps are turned on, the HV_ON signal is asserted at +Vcc. Diode connected Z-type transistors M6 and M7 hold nodes A and C at +Vcc if the threshold voltages of M6 and M7 are assumed to be negligible because the body effect is small voltages at the level of the HV_ON signal. The high-voltage charge pump increases the voltage at the drains of transistors M1 and M3 to a high voltage. Because Vgs for transistors M1 and M3 is −Vcc, and because the body effect has increased the threshold voltages for transistors M1 and M3, there is no leakage current through transistors M1 and M3; therefore, the high voltage pump connected to M1 and M3 is not loaded by the unselected block decoder control circuit. In order to use the embodiment 600 of the block decoder control circuit 201 according to the present invention, the junction breakdown and oxide breakdown voltages of the Z-type transistor must be equal to or greater than VppPlus, because transistors M1 and M3 have drain to gate voltages of VppPlus when the block decoder control circuit is not selected.

When the block decoder control circuit 600 is selected, the DECODE signal is asserted at +Vcc, so that transistors M8, M9, and M10 are in cut off, thereby allowing nodes B, D, and the PASS signal to rise. The cycling of the clocks PHI and /PHI couple up nodes D and B alternately. On the rising edge of PHI, the voltage at node D is increased by an amount equal to Vcc * C1/(C1+CD), in which CD is the total parasitic capacitance at node D. In order for the transistors M1, M2, and M5 to be turned on, it is necessary that the amount of voltage increase due to coupling be greater than the threshold voltages of the transistors M1, M2, and M5. Therefore Vcc * C1/(C1+CD)>VTz. Because all of the transistors M1–M5 are Z-type transistors, their threshold voltages VTz are nearly zero assuming no back biasing effect. This allows the capacitor C1 to be relatively small while still satisfying the above inequality. Moreover, the PASS node is not directly charged or coupled up by capacitor C1, but rather is charged by the high voltage charge pump through the series combination of M1 and M5. At the rising edge of /PHI, node B is increased in voltage by Vcc * C2/(C2+CB), where CB is the total parasitic capacitance of node B. This voltage increase is enough to turn on the series transistor pair M3 and M4 so that node D is charged to the high voltage VppPlus. Because the transistors M6 and M7 are diode-connected so as to conduct only from the HV_ON signal to the nodes A and C, but not in the opposite direction, transistors M6 and M7 are in cut off when the block decoder control circuit 600 is selected.

An important advantage of the present invention lies in the usage of the high voltage signal VppPlus as the high voltage supply CNTL_Vpp of the block decoder control circuit 201. Referring back to FIG. 2, it is necessary for the voltage on the PASS signal to exceed the highest voltage on XT(15:0) by one threshold voltage VThigh in order for the high voltage transmission circuit 202 to pass the full voltage XT(15:0) to the outputs WL(15:0). If the signals XT(15:0) and the block decoder control circuit supply voltage CNTL_Vpp are both the same voltage Vpp as in conventional circuits, then the PASS signal generated by the block decoder control circuit can only exceed Vpp due to capacitive coupling within the block decoder control circuit. In other words, because the supply CNTL_Vpp to the block decoder control circuit 201 is only equal to the highest block input XT(15:0) for conventional circuits, the supply CNTL_Vpp cannot drive the PASS signal higher than the highest voltage of XT(15:0). Because the capacitive coupling of any given node increases that node's voltage for at most one phase of a two-phase clock, the high voltage transmission circuit 202 can only pass the full highest voltage on inputs XT(15:0) for at most half of the time in conventional circuits.

In contrast, according to the present invention, the supply voltage CNTL_Vpp for the block decoder control circuit 201 is VppPlus, which is at least one transistor threshold voltage VThigh above the high voltage Vpp to which the highest signal voltage of XT(15:0) is attached Because max(XT(15:0))+VThigh=VppPlus, the high voltage transmission circuit 202 is optimally used according to the present invention. The PASS signal is always driven at least one threshold voltage VThigh above the high voltage supply Vpp during all phases of the clocks. More importantly, the area is smaller because the global charge pump drives the high loading PASS node, therefore no large coupling capacitors need exist.

Referring to FIG. 7, VppPlus and Vpp are generated by separate charge pumps according to the present invention. A diode connected regulation transistor 707 regulates VppPlus to be greater than one threshold voltage VThigh above Vpp. According to the present invention, it is possible to regulate the VppPlus to be greater than VThigh above Vpp by fabricating the regulation transistor 707 such its channel length is longer than the channel lengths of the other enhancement devices. In this way, the voltage VppPlus can be regulated so as to be equal to Vpp plus VThigh plus a predetermined voltage margin. The predetermined voltage margin is the difference between the threshold voltages of the normal enhancement mode devices, and the threshold voltage of the regulation transistor 707. Ideally, VppPlus and Vpp are driven from separate outputs of a multistage strong global charge pump. Alternatively, Vpp and VppPlus may be generated by separate charge pumps. In both cases, Vpp is regulated at the programming voltage, and transistor 707 regulates VppPlus relative to Vpp. Therefore, transistor 707's channel length is used to create the proper voltage difference between VppPlus and Vpp. This proper voltage difference includes a suitable margin greater than a standard diode drop.

Figure 8:
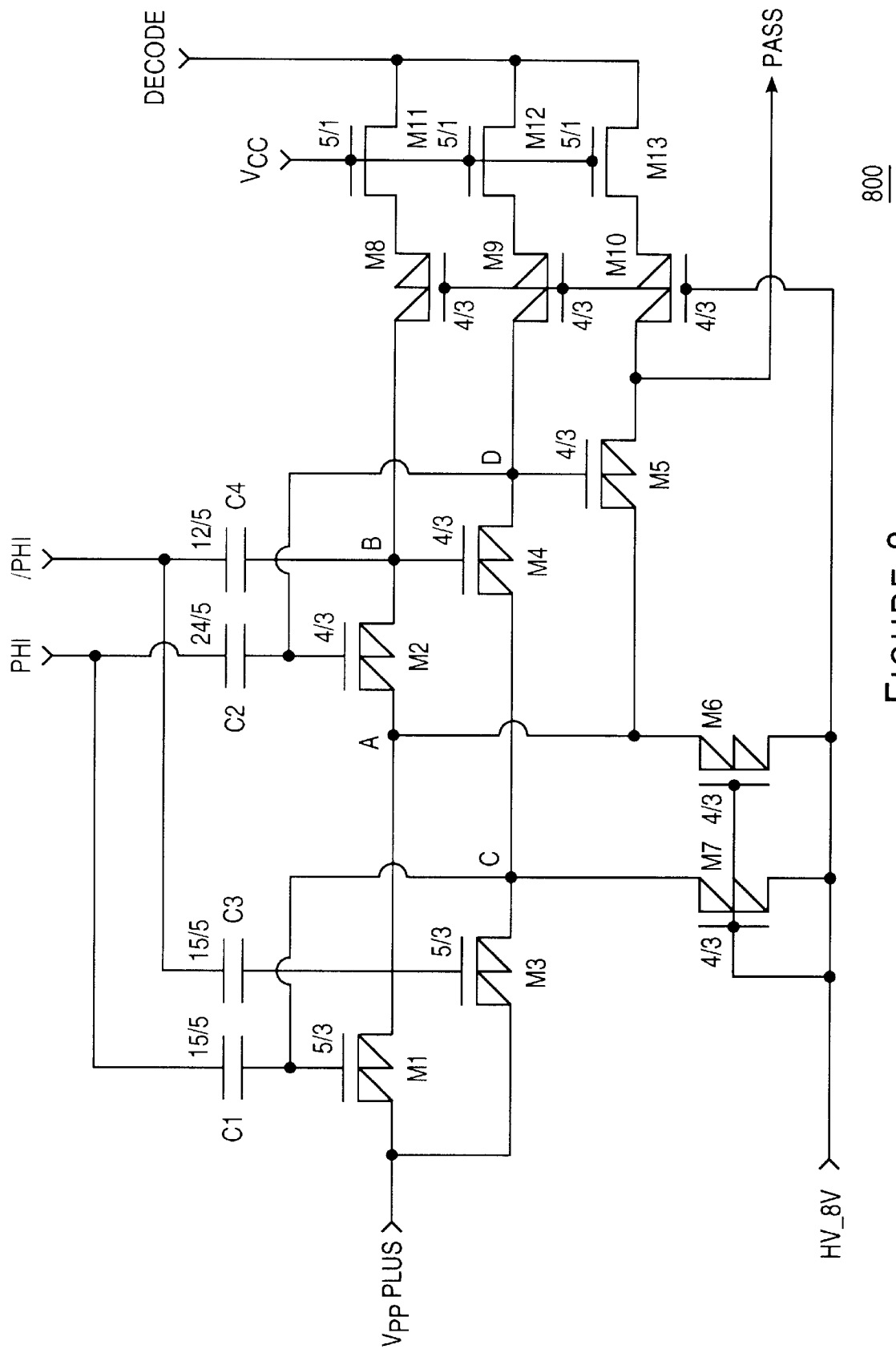
FIG. 8 illustrates another embodiment according to the present invention of a block decoder control circuit using enhancement transistors.

FIG. 8 illustrates another embodiment 800 of the block decoder control circuit 201 according to the present invention which is useful when the threshold voltage VThigh can be made somewhat lower to 1.5 Volts with 20 Volts of back bias body effect. The advantage of the embodiment 800 is that only one type of transistor is used both for the block decoder control circuit 201 and the high voltage transmission circuit 202. Because only one type of transistor is used, the fabrication process is potentially simplified. When the block decoder control circuit 800 is unselected, the DECODE signal is low and turns on transistors M11, M12, and M13. When the high voltage charge pumps are also turned on, a signal HV_8 V at about eight volts is asserted. Nodes B and D and the PASS signal are discharged to ground in an unselected block decoder control circuit 800. Similarly, the diode-connected transistors M6 and M7 charge nodes A and C to about 6.5 Volts. The gates of transistors M1 and M3 are therefore charged to about 6.5 Volts in an unselected block decoder control circuit 800 according to the present invention. This 6.5 Volt gate voltage allows the voltage across the gate oxide in transistors M1 and M3 to be less than the oxide rupture voltage. In addition, the gate voltage increases the junction breakdown voltage for the depletion regions at the drain of transistors M1 and M3, thereby allowing VppPlus to be safely carried at the drain of transistors M1 and M3. From among nodes A, B, C, and D, node D has the highest capacitance connected to it because of the inclusion of transistor M5. In order to turn on transistors M2 and M5 during the high phase of PHI, the node D must be coupled up to a voltage above the threshold voltage of transistors M2 and M5. Thus, Vcc * C2/(C2+CD)>VThigh. This can be rewritten as follows.

$$C2 > CD * VThigh/(Vcc-VThigh)$$

This inequality states that C2 must increase as CD increases, as VThigh increases, and as Vcc decreases. As VThigh approaches Vcc, the denominator of the above expression becomes small, thereby requiring C2 to become very large. As illustrated in FIG. 8, capacitance C2 is implemented as the gate capacitance of a transistor having 24 design rule distances of transistor width and 5 design rule distances of channel length.

Figure 9:
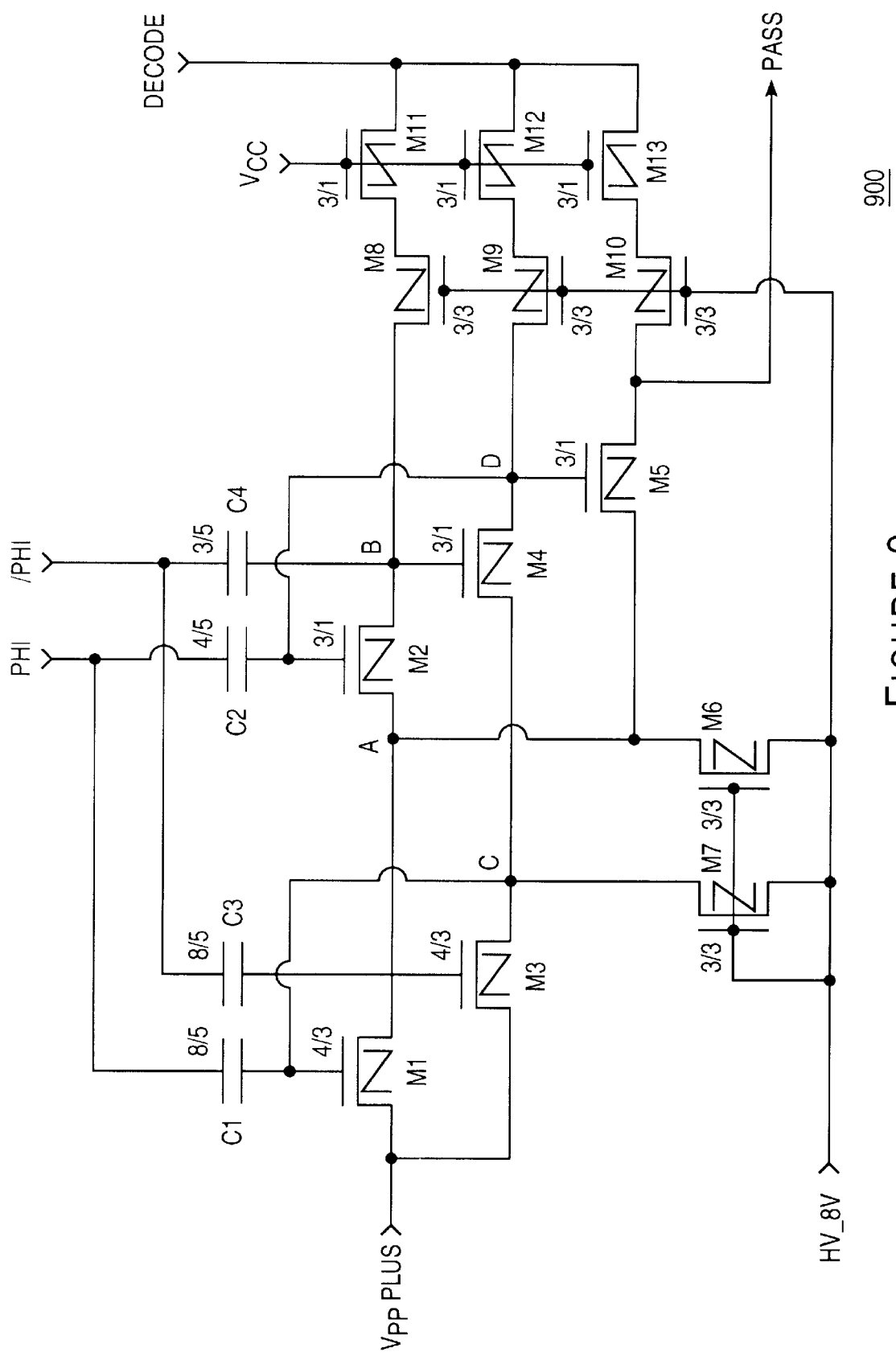
FIG. 9 illustrates yet another embodiment according to the present invention of a block decoder control circuit using Z-type transistors.

FIG. 9 illustrates another embodiment 900 of a block decoder control circuit according to the present invention. The embodiment 900 illustrated in FIG. 9 has the same connectivity as the embodiment 800 illustrated in FIG. 8. In the embodiment 900 illustrated in FIG. 9, however, all of the transistors are Z-type transistors, which are fabricated so as to have threshold voltages VTz of about 0.3 Volts with no body effect at low voltages, but to have a threshold voltage VTz of about 1.3 Volts when 20 Volts of body effect back biasing is present. In the embodiment 900 illustrated in FIG. 9, the following relationship must hold.

$$C2 > CD * VTz/(Vcc-VTz)$$

Because VTz is significantly lower than VThigh, capacitor C2 can be implemented to be much smaller than in the embodiment 800 illustrated in FIG. 8. The capacitor C2 in FIG. 9 is implemented with the gate capacitance of a four design rule width and five design rule length transistor; therefore is only one sixth the size of C2 illustrated in FIG. 8.

Another variation of the circuit design shown in FIGS. 8 and 9 includes Z-type transistors M1 and M3 and normal enhancement mode transistors for M2 and M4 through M13. By using Z-type transistors M1 and M3, the size of capacitors C1 and C3 illustrated in FIG. 8 can be reduced, thereby saving area. However, there is essentially zero leakage current sourced from the VppPlus charge pump in this variation.

Figure 10:
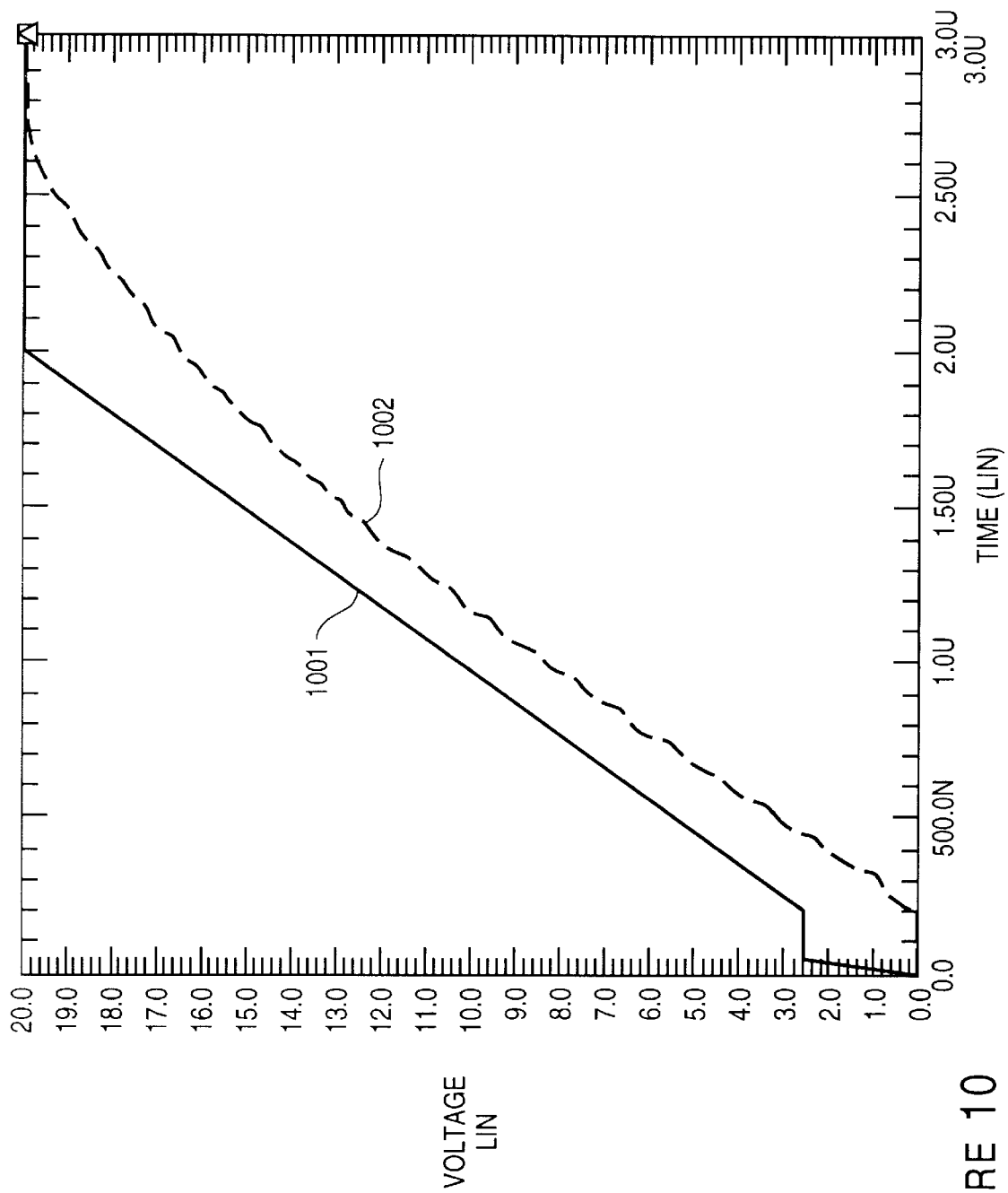
FIG. 10 is a graph illustrating the voltage at the output of a high-voltage generator and the voltage of a representative word line during a programming operation using the block decoder control circuit in FIG. 9 in the block decoder of FIG. 2.

FIG. 10 illustrates the input 1001 and output 1002 of the high voltage transmission circuit 202 when controlled using the block decoder control circuit 900 according to the present invention. FIG. 10 illustrates the programming of a selected word, wL(0), for example. The input XT(0) to the pass transistor 316 in the high voltage transmission circuit 202 increases from 0 to 20 Volts roughly linearly over a 2.0 microsecond time interval. The output wL(0) 1002 reaches Vpp at about 2.7 microseconds. The simulation result illustrated in FIG. 10 assumes a 2.0 picofarad capacitance attached to the word line wL(0). The PASS node which controls the high voltage transmission circuit 202 is assumed to have a 0.2 picofarad capacitance.

Figure 11:
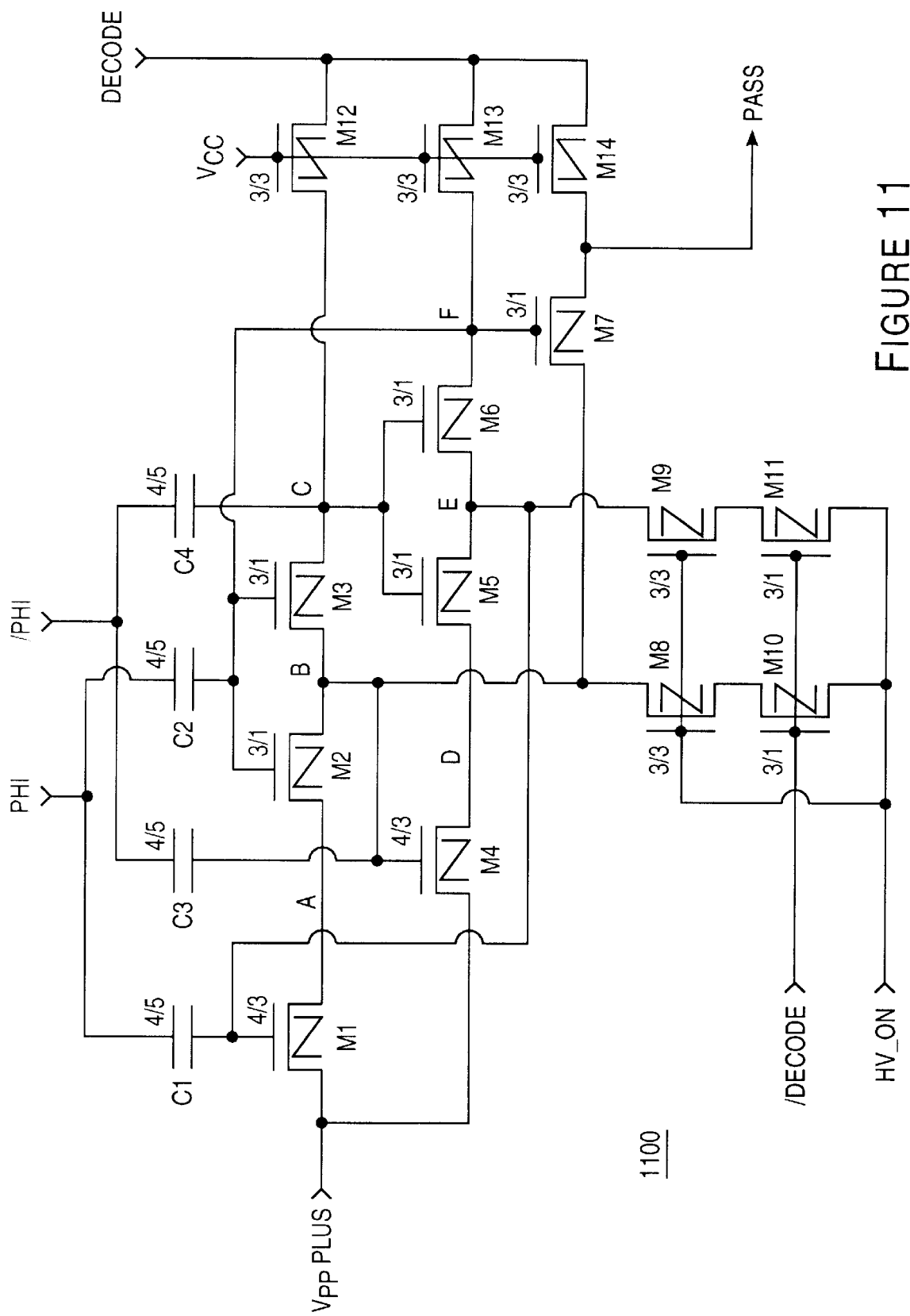
FIG. 11 illustrates still another embodiment according to the present invention of a block decoder control circuit using Z-type transistors.

FIG. 11 illustrates a block decoder control circuit 1100 according to the present invention constructed entirely using Z-type transistors. When the block decoder control circuit 1100 is unselected, the DECODE signal is at held at zero volts. This turns on transistors M12, M13, and M14, which hold nodes C, F, and the PASS signal to ground. The /DECODE signal is asserted to Vcc when the block decoder control circuit 1100 is unselected, thus turning on transistors M10 and M11. When the high voltages Vpp and VppPlus are being generated, the HV_ON signal is asserted at Vcc, thus turning on transistors M8 and M9. With the series M8 and M10 turned on, node B is charged to Vcc, assuming that the threshold voltage of transistors M8 and M10 are small. Similarly, with the series M9 and M11 turned on, node E is charged to Vcc. Although a small amount of leakage current may exist through transistors M3, M6, and M7, this leakage current is from the HV_ON signal which is supplied by the normal Vcc power supply, not from a high voltage generator. With the gates of transistors M2 and M5 held at ground and the voltages at the sources of these transistors held at Vcc, the gate to source voltage Vgs for these two transistors is −Vcc, therefore the transistors M2 and M5 are turned off. The gates of transistors M1 and M4 are held at Vcc. This allows the very small parasitic source capacitances at nodes A and D to be charged to about +Vcc. For small gate voltages, the junction breakdown voltage of a transistor increases directly with the increase in gate voltage. Because the gates of transistors M1 and M4 are charged to about +Vcc, the junction breakdown voltages at the drains of M1 and M4 are increased to about 20 Volts +Vcc, or about 23 Volts. Because VppPlus at the drains of transistors M1 and M4 is only about 22 Volts, the risk of junction breakdown at the drains of transistors M1 and M4 is eliminated by the gate biasing of these transistors. Transistors M2 and M5 are strongly turned off because their gate to source voltages are about −Vcc. Thus, the series pair M1 and M2 and the series pair M4 and M5 do not source any leakage current from the high voltage charge pump which supplies VppPlus. Because transistors M1 and M4 are gated by Vcc, the risk of junction breakdown is eliminated.

When the block decoder control circuit 1100 is selected, the DECODE signal is asserted at +Vcc. Because the sources of transistors M12, M13, and M14 are elevated to +Vcc, the body effect increases the threshold voltage of transistors M12, M13, and M14 so that these transistors are safely turned off, and no leakage occurs when the gate and source voltages are both +Vcc. This allows nodes C, F, and PASS to be elevated to VppPlus. Furthermore, because the gate voltages of transistors M12, M13, and M14 are held at +Vcc, the junction breakdown voltage of these transistors is elevated above VppPlus. The /DECODE signal is deasserted to zero volts when the block decoder control circuit is selected. Because the source of transistors M10 and Mll are raised to +Vcc by the signal HV_ON when the high voltage is being generated, the gate to source voltages Vgs of transistors M10 and M11 are −Vcc when the block decoder control circuit is selected; therefore, transistors M10 and M11 are turned off so that the series pair of transistors M8 and M10 does not affect node B and the series pair of transistors M9 and M11 does not affect node E. Because the gates of transistors M8 and M9 are raised to +Vcc by the signal HV_ON, nodes B and E, which are connected to the drains of transistors M8 and M9, can safely be elevated to VppPlus without the risk of the occurrence of junction breakdown.

Figure 12A:
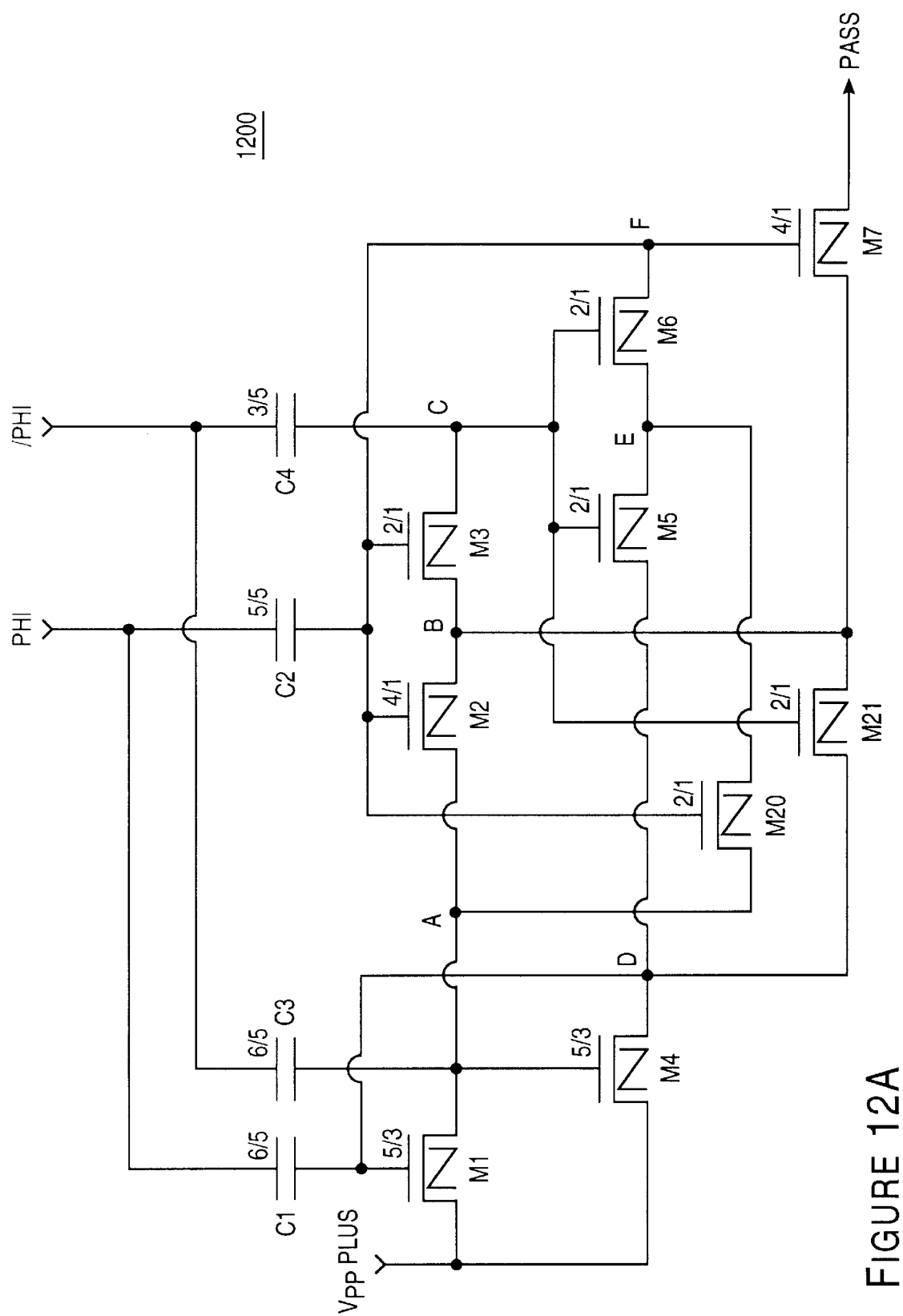
FIG. 12A illustrates a boosting portion of a further embodiment according to the present invention of a block decoder control circuit using Z-type transistors.
Figure 12B:
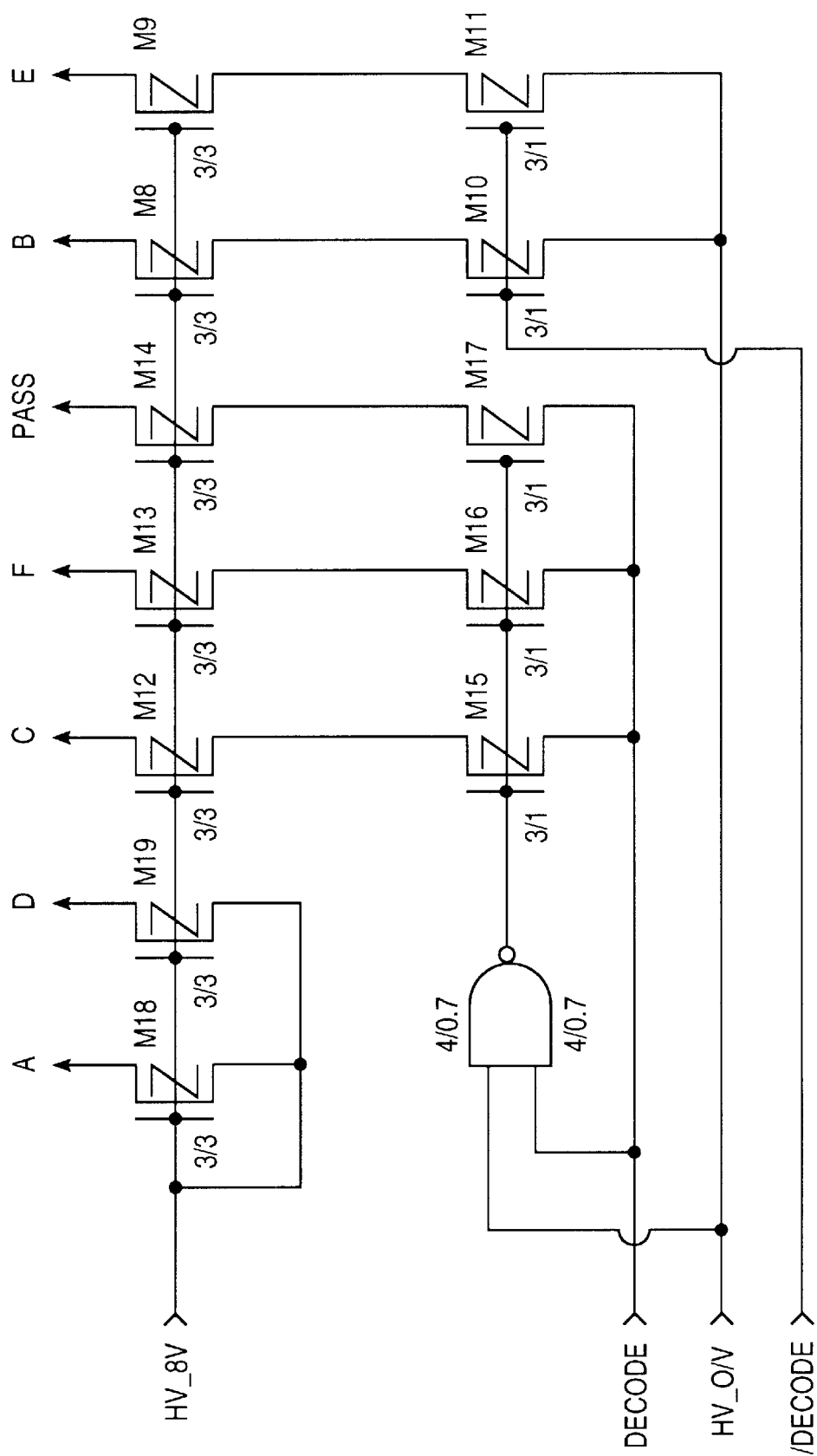
FIG. 12B illustrates a regulation and discharge portion of a further embodiment according to the present invention of a block decoder control circuit using Z-type transistors.

FIGS. 12A and 12B together represent the presently preferred embodiment 1200 & 1201 of the block decoder control circuit 201 according to the present invention. There is no danger of junction breakdown or oxide breakdown in the embodiment 1200 & 1201 regardless of whether the block decoder control circuit 1200 & 1201 is selected or unselected. For the unselected blocks, the drains of transistors M1 and M4 are the only circuit elements directly tied to VppPlus, the highest voltage supply. Transistors M18 and M19 are diode connected so as to charge nodes A and D to about eight volts through the signal HV_8 V when the high voltage is being generated. Because nodes A and D are attached to the gates and sources of transistors M1 and M4, transistors M1 and M4 have elevated junction breakdown requirements.

During the high phase of /PHI, node C is coupled up by capacitor C4, thereby turning on transistors M5 and M6. At the same time, node A is coupled up by capacitor C3, thereby turning on transistor M4. As a result, node F is charged by the series combination of M4, M5, and M6. As node F is charged, the voltage at the gate of transistor M3 is increased. If coupling boost transistor M21 were not present, then the voltage at node C could be decreased by a current flow through transistor M3 to node B. Because transistor M7 is attached to a large capacitance PASS node, transistors M7 and M3 in series could pull the voltage at node C down to the voltage at the PASS node if coupling boost transistor M21 were not present.

In order to prevent the above-described degradation of node C during the low phase of PHI, coupling boost transistor M21 is introduced to provide a charging path from VppPlus to the PASS node through transistors M4, M21, and M7. With the inclusion of transistor M21, charge sharing from node C to node B does not occur because node B is held at a high level by transistors M4 and M21 even if the PASS node is still charging up during the low phase of PHI.

The inclusion of transistor M21 also provides an overall faster rise time for the highly capacitive PASS node, because the PASS node can be charged during both phases of the clocks PHI and /PHI.

Similarly, on the high phase of PHI, node F is coupled up by capacitor C2, and node D is coupled up by capacitor C1. The series combination of transistors M1, M2, and M3 permits node C to be charged by VppPlus. As node C is charged, in the absence of coupling boost transistor M20, the voltage at node F could be degraded by charge sharing with node E through transistor M6. In order to prevent this charge sharing from occurring, coupling boost transistor M20 is introduced so that node E is held to a high voltage during the high phase of PHI by transistors M1 and M20.

In contrast to the situation regarding node B in which the large capacitance PASS node is connected through transistor M7, there is no large capacitance node connected to node E. Therefore, the functional importance of coupling boost transistor M20 is less than the functional importance of coupling boost transistor M21. Thus, the circuit 1200 shown in FIG. 12A can alternatively be implemented with transistor M20 omitted.

Although the various aspects of the present invention have been described with reference to its several embodiments, those embodiments are presented by way of example, not by way of limitation. Those skilled in the art will be enabled by this disclosure to make various additions and modifications to the embodiments. Accordingly, those additions and modifications are deemed to lie within the spirit and scope of the invention as set out in the claims.

What is claimed is:

1. A high voltage pass gate, comprising:
   first and second coupling capacitors each having upper and lower plates;
   a plurality of transistors, each transistor having a corresponding gate, source, and drain, wherein the plurality of transistors comprises:
   first, second, and third series boost transistors;

first and second isolation boost transistors;

wherein the first series boost transistor source, the second isolation boost transistor gate, the second series boost transistor gate, and the second coupling capacitor lower plate are coupled;

wherein the second series boost transistor source, the first isolation boost transistor gate, the first series boost transistor gate, the third series boost transistor gate, and the first coupling capacitor lower plate are coupled;

wherein the first isolation boost transistor source, first series boost transistor drain, and the third series boost transistor drain are coupled;

wherein the second isolation boost transistor source and the second series boost transistor drain are coupled;

wherein the first isolation boost transistor drain and the second isolation boost transistor drain are coupled to a high voltage control node; and wherein the first coupling capacitor upper terminal is coupled to a first clock input, and the second coupling capacitor upper terminal is coupled to a second clock input.

2. A high voltage pass gate as in claim 1, further comprising:

first, second, and third discharge transistors;

wherein the first discharge transistor drain is coupled to the second coupling capacitor lower plate, the second discharge transistor drain is coupled to the first coupling capacitor lower plate, and the third discharge transistor drain is coupled to the third series boost transistor source.

3. A high voltage pass gate as in claim 2, further comprising:

first and second regulation transistors;

wherein the first regulation transistor drain is coupled to the first isolation boost transistor source, the second regulation transistor drain is coupled to the second isolation boost transistor source; and wherein the first regulation transistor gate and source and the second regulation transistor gate and source are coupled to a generator on signal.

4. A high voltage pass gate as in claim 3, further comprising:

one or more pass transistors;

wherein the third series boost transistor source is coupled to the pass transistor gates, the pass transistor drains are coupled to a high voltage generator node, and the pass transistor sources are coupled to a word line.

5. A high voltage pass gate as in claim 2, wherein a positive supply voltage is coupled to the first, second, and third discharge transistor gates, and a decode input is coupled to the first, second, and third discharge transistor source.

6. A high voltage pass gate as in claim 1, wherein the plurality of transistors comprise Z-type transistors.

7. A high voltage pass gate as in claim 4, wherein the pass transistors comprise enhancement transistors.

8. A high voltage pass gate as in claim 7, wherein the high voltage control node is regulated such that its voltage is at least one enhancement transistor threshold voltage higher than a voltage at the high voltage generator node.

9. A high voltage pass gate as in claim 7, wherein the high voltage control node is regulated such that its voltage is one enhancement transistor threshold voltage higher than a voltage at the high voltage generator node plus a predetermined voltage margin.

10. A high voltage pass gate, comprising:

first, second, third, and fourth coupling capacitors each having upper and lower plates;

a plurality of transistors, each transistor having a corresponding gate, source, and drain, wherein the plurality of transistors comprises:

first, second, and third series boost transistors;

first and second isolation boost transistors;

wherein the first series boost transistor source, the second series boost transistor gate, and the fourth coupling capacitor lower plate are coupled;

wherein the second series boost transistor source, the first series boost transistor gate, the third series boost transistor gate, and the second coupling capacitor lower plate are coupled;

wherein the first isolation boost transistor source, the first series boost transistor drain, the third series boost transistor drain, the second isolation boost transistor gate, and the third coupling capacitor lower terminal are coupled;

wherein the second isolation boost transistor source, the second series boost transistor drain, the first isolation boost transistor gate, and the first coupling capacitor lower terminal are coupled;

wherein the first isolation boost transistor drain and the second isolation boost transistor drain are coupled to a high voltage control node; and wherein the first coupling capacitor upper terminal and second coupling capacitor upper terminal are coupled to a first clock input, and the second coupling capacitor upper terminal and the fourth coupling capacitor upper terminal are coupled to a second clock input.

11. A high voltage pass gate as in claim 10, further comprising:

first, second, and third discharge transistors;

wherein the first discharge transistor drain is coupled to the fourth coupling capacitor lower plate, the second discharge transistor drain is coupled to the second coupling capacitor lower plate, and the third discharge transistor drain is coupled to the third series boost transistor source.

12. A high voltage pass gate as in claim 11, further comprising:

first and second regulation transistors;

wherein the first regulation transistor drain is coupled to the first isolation boost transistor source, the second regulation transistor drain is coupled to the second isolation boost transistor source; and wherein the first regulation transistor gate and source and the second regulation transistor gate and source are coupled to an intermediate high-voltage generator on signal.

13. A high voltage pass gate as in claim 12, further comprising:

one or more pass transistors;

wherein the third series boost transistor source is coupled to the pass transistor gates, the pass transistor drains are coupled to a high voltage generator node, and the pass transistor sources are coupled to a word line.

14. A high voltage pass gate as in claim 12, further comprising:

first, second, and third series discharge transistors;

wherein the first discharge transistor source is coupled to the first series discharge transistor drain, the second discharge transistor source is coupled to the second series discharge transistor drain, and the third discharge transistor source is coupled to the third series discharge transistor drain;

wherein a positive supply voltage is coupled to the first, second, and third series discharge transistor gates, and a decode input is coupled to the first, second, and third series discharge transistor sources; and wherein the first, second, and third discharge transistor gates are coupled to the intermediate high-voltage generator on signal.

15. A high voltage pass gate as in claim 10, wherein the plurality of transistors comprise Z-type transistors.

16. A high voltage pass gate as in claim 10, wherein the plurality of transistors comprise enhancement transistors.

17. A high voltage pass gate as in claim 13, wherein the pass transistors comprise enhancement transistors.

18. A high voltage pass gate as in claim 17, wherein the high voltage control node is regulated such that its voltage is one enhancement transistor threshold voltage higher than a voltage at the high voltage generator node.

19. A high voltage pass gate as in claim 10, wherein the first and second isolation boost transistors comprise Z-type transistors; and wherein the first, second, and third series boost transistors comprise enhancement transistors.

20. A high voltage pass gate as in claim 17, wherein the high voltage control node is regulated such that its voltage is one enhancement transistor threshold voltage higher than a voltage at the high voltage generator node plus a predetermined voltage margin.

21. A high voltage pass gate, comprising:

first, second, third, and fourth coupling capacitors each having upper and lower plates;

a plurality of transistors, each transistor having a corresponding gate, source, and drain, wherein the plurality of transistors comprises:
  first, second, and third series boost transistors;
  first and second isolation boost transistors;
  first and second decoupling boost transistors;
  wherein the first series boost transistor source, the second isolation boost transistor gate, the second series boost transistor gate, and the fourth coupling capacitor lower plate are coupled;
  wherein the second series boost transistor source, the first isolation boost transistor gate, the first series boost transistor gate, the third series boost transistor gate, and the second coupling capacitor lower plate are coupled;
  wherein the first isolation boost transistor source, first series boost transistor drain, the third series boost transistor drain, the second decoupling boost transistor gate, and the third coupling capacitor lower plate are coupled;
  wherein the second isolation boost transistor source, the second series boost transistor drain, the first decoupling boost transistor gate, and the first coupling capacitor lower plate are coupled;
  wherein the first decoupling boost transistor source and the second isolation boost transistor drain are coupled;
  wherein the second decoupling boost transistor source and the second isolation boost transistor drain are coupled;
  wherein the first isolation boost transistor drain and the second isolation boost transistor drain are coupled to a high voltage control node; and
  wherein the first and second coupling capacitor upper terminals are coupled to a first clock input, and the third and fourth coupling capacitor upper terminals are coupled to a second clock input.

22. A high voltage pass gate as in claim 21, further comprising:

first, second, and third discharge transistors;

wherein the first discharge transistor drain is coupled to the fourth coupling capacitor lower plate, the second discharge transistor drain is coupled to the second coupling capacitor lower plate, and the third discharge transistor drain is coupled to the third series boost transistor source;

wherein the first, second, and third discharge transistor sources are coupled to a decode signal; and wherein the first, second, and third discharge transistor gates are coupled to a positive supply voltage.

23. A high voltage pass gate as in claim 21, further comprising:

first and second regulation transistors; and first and second series regulation transistors;

wherein the first regulation transistor drain is coupled to the first isolation boost transistor source, the second regulation transistor drain is coupled to the second isolation boost transistor source;

wherein the first and second regulation transistor gates and the first and second series regulation transistor sources are coupled to a generator on signal;

wherein the first and second series regulation transistor gates are coupled to an inverted decode signal.

24. A high voltage pass gate as in claim 23, further comprising:

one or more pass transistors;

wherein the third series boost transistor source is coupled to the pass transistor gates, the pass transistor drains are coupled to a high voltage generator node, and the pass transistor sources are coupled to a word line.

25. A high voltage pass gate as in claim 23, wherein the plurality of transistors comprise Z-type transistors.

26. A high voltage pass gate as in claim 23, wherein the plurality of transistors comprise enhancement transistors.

27. A high voltage pass gate as in claim 24, wherein the pass transistors comprise enhancement transistors.

28. A high voltage pass gate as in claim 27, wherein the high voltage control node is regulated such that its voltage is one enhancement transistor threshold voltage higher than a voltage at the high voltage generator node.

29. A high voltage pass gate as in claim 27,
wherein the high voltage control node is regulated such that its voltage is one enhancement transistor threshold voltage higher than a voltage at the high voltage generator node plus a predetermined voltage margin.

30. A high voltage pass gate, comprising:
first, second, third, and fourth coupling capacitors each having upper and lower plates;
a plurality of transistors, each transistor having a corresponding gate, source, and drain, wherein the plurality of transistors comprises:
first, second, and third series boost transistors;
first and second isolation boost transistors;
first and second decoupling boost transistors;
wherein the first series boost transistor source, the second isolation boost transistor gate, the second series boost transistor gate, and the fourth coupling capacitor lower plate are coupled;
wherein the second series boost transistor source, the first isolation boost transistor gate, the first series boost transistor gate, the third series boost transistor gate, and the second coupling capacitor lower plate are coupled;
wherein the first isolation boost transistor source, and the first series boost transistor drain, and the third series boost transistor drain are coupled;
wherein the second isolation boost transistor source and the second series boost transistor drain are coupled;
wherein the first decoupling boost transistor source, the first isolation boost transistor drain, and the second decoupling boost transistor gate are coupled;
wherein the second decoupling boost transistor source, the second isolation boost transistor drain, and the first decoupling boost transistor gate are coupled;
wherein the first isolation boost transistor drain and the second isolation boost transistor drain are coupled to a high voltage control node; and
wherein the first and second coupling capacitor upper terminals are coupled to a first clock input, and the third and fourth coupling capacitor upper terminals are coupled to a second clock input.

31. A high voltage pass gate as in claim 30, further comprising:
first and second coupling boost transistors;
wherein the first coupling boost transistor drain is coupled to the first decoupling boost transistor source, the first coupling boost transistor gate is coupled to the second coupling capacitor lower terminal, and the first coupling boost transistor source is coupled to the second series boost transistor drain; and
wherein the second coupling boost transistor drain is coupled to the second decoupling boost transistor source, the second coupling boost transistor gate is coupled to the fourth coupling capacitor lower terminal, and the second coupling boost transistor source is coupled to first series boost transistor drain.

32. A high voltage pass gate as in claim 31, further comprising:
first, second, and third discharge transistors;
first and second intermediate regulation transistors; and
first and second regulation transistors;
wherein the first discharge transistor drain is coupled to the fourth coupling capacitor lower plate, the second discharge transistor drain is coupled to the second coupling capacitor lower plate, and the third discharge transistor drain is coupled to the third series boost transistor source;
wherein the first intermediate regulation transistor drain is coupled to the first isolation boost transistor source, and the second intermediate regulation transistor drain is coupled to the second isolation boost transistor source;
wherein the first regulation transistor drain is coupled to the third coupling capacitor lower plate, and the second regulation transistor drain is coupled to the first decoupling capacitor lower plate;
wherein the first, second, and third discharge transistor gates, the first and second regulation transistor gates and sources, and the first and second intermediate regulation transistor gates are coupled to an intermediate high voltage generator on signal.

33. A high voltage pass gate as in claim 32, further comprising:
first, second, and third series discharge transistors; and
first and second series intermediate regulation transistors;
wherein the first series discharge transistor drain is coupled to the first discharge transistor source, the second series discharge transistor drain is coupled to the second discharge transistor source, and the third series discharge transistor drain is coupled to the third discharge transistor source;
wherein the first series intermediate regulation transistor drain is coupled to the first intermediate regulation transistor source, and the second series intermediate regulation transistor drain is coupled to the second intermediate regulation transistor source;
wherein the first, second, and third series discharge transistor sources are coupled to a decode signal;
wherein the first and second series intermediate regulation transistor gates are coupled to an inverted decode signal; and
wherein the first and second series intermediate regulation transistor sources are coupled to a generator on logic signal.

34. A high voltage pass gate as in claim 33,
wherein the first, second, and third series discharge transistor gates are coupled to a logical nand of the decode signal and the generator on logic signal.

35. A high voltage pass gate as in claim 32, further comprising:
one or more pass transistors;
wherein the third series boost transistor source is coupled to the pass transistor gates, the pass transistor drains are coupled to a high voltage generator node, and the pass transistor sources are coupled to a word line.

36. A high voltage pass gate as in claim 30,
wherein the plurality of transistors comprise Z-type transistors.

37. A high voltage pass gate as in claim 35,
wherein the pass transistors comprise enhancement transistors.

38. A high voltage pass gate as in claim 37,
wherein the high voltage control node is regulated such that its voltage is one enhancement transistor threshold voltage higher than a voltage at the high voltage generator node.

39. A high voltage pass gate as in claim 30, further comprising:

a coupling boost transistor;

wherein the coupling boost transistor drain is coupled to the second decoupling boost transistor source, the coupling boost transistor gate is coupled to the fourth coupling capacitor lower terminal, and the coupling boost transistor source is coupled to first series boost transistor drain.

40. A high voltage pass gate as in claim 36, wherein the high voltage control node is regulated such that its voltage is one enhancement transistor threshold voltage higher than a voltage at the high voltage generator node plus a predetermined voltage margin.

* * * * *